(12) United States Patent
Lim

(10) Patent No.: US 7,060,609 B2
(45) Date of Patent: Jun. 13, 2006

(54) METHOD OF MANUFACTURING A SEMICONDUCTOR DEVICE

(75) Inventor: Bi O Lim, Seoul (KR)

(73) Assignee: DongbuAnam Semiconductor Inc., Seoul (KR)

( * ) Notice: Subject to any disclaimer, the term of this patent is extended or adjusted under 35 U.S.C. 154(b) by 0 days.

(21) Appl. No.: 10/730,940

(22) Filed: Dec. 10, 2003

(65) Prior Publication Data

US 2004/0115929 A1   Jun. 17, 2004

(30) Foreign Application Priority Data

Dec. 14, 2002   (KR) .................. 10-2002-0080015

(51) Int. Cl.
*H01L 21/44*   (2006.01)
*H01L 21/4763*   (2006.01)
*H01L 21/3205*   (2006.01)

(52) U.S. Cl. .................. 438/652; 438/586; 438/643; 438/683

(58) Field of Classification Search ............... 438/652, 438/586, 658, 653, 643, 683
See application file for complete search history.

(56) References Cited

U.S. PATENT DOCUMENTS

| | | | | |
|---|---|---|---|---|
| 6,139,700 A | * | 10/2000 | Kang et al. | 204/192.17 |
| 6,391,785 B1 | * | 5/2002 | Satta et al. | 438/704 |
| 6,482,733 B1 | | 11/2002 | Raaijmakers et al. | |
| 2004/0115913 A1 | * | 6/2004 | Jung et al. | 438/586 |

* cited by examiner

*Primary Examiner*—Chuong Anh Luu
(74) *Attorney, Agent, or Firm*—Pillsbury Winthrop Shaw Pittman LLP

(57) ABSTRACT

A method of manufacturing a semiconductor device is disclosed wherein a tungsten single atomic layer is deposited in a contact or via hole of a silicon substrate. A tungsten nitride (WN) layer is formed by plasma processing the tungsten single atomic layer using an atomic layer deposition process, which is repeated to form the tungsten nitride layer having a desired thickness as the barrier metal. A tungsten layer is then deposited on the semiconductor substrate to fill the contact hole. The tungsten nitride layer and the tungsten layer are in-situ deposited in a same reaction chamber for tungsten process. Accordingly, the step coverage of the tungsten nitride layer, is improved, thus reducing the contact defects of the fine contact hole, which has a high aspect ratio.

14 Claims, 4 Drawing Sheets

METHOD OF MANUFACTURING A SEMICONDUCTOR DEVICE

CROSS REFERENCE TO RELATED APPLICATIONS

This application relates to and claims priority to the Republic of Korea Patent Application No. 10-2002-0080015, filed on Dec. 14, 2002, the contents of which are incorporated herein by reference.

BACKGROUND OF THE INVENTION

1. Field of the Invention

The present invention relates to a method of manufacturing a semiconductor device and, more particularly, to a method of manufacturing a semiconductor device, which performs deposition of a barrier metal (e.g., a tungsten nitride (WN) layer) in a fine contact hole having high aspect ratio by an atomic layer deposition process.

2. Description of Related Art

Generally, with the high integration of semiconductor devices, the size of a source/drain and a line width of a gate electrode of a MOS transistor and a line width of metal layer are reduced. In particular, when the line width of the metal layer is reduced, the aspect ratio of a contact hole or a via hole is increased. Accordingly, a conventional physical vapor deposition (PVD) process has a limitation in filling the contact hole or via hole with a tungsten layer. Recently, to solve this problem, a new method of forming a metal layer was developed whereby a contact hole or via hole is filled with a tungsten layer using a chemical vapor deposition (CVD) process and the tungsten layer remains only in the contact hole or via hole by using a chemical mechanical polishing (CMP) process. The tungsten layer is planarized and an aluminum layer is formed on the tungsten layer on the contact hole or via hole. Such process is called a plug process.

In a contact hole having an exposed silicon substrate or a poly silicon layer, a Ti/TiN layer is generally deposited in the contact hole to prevent damage of a bottom face of the contact hole by a fluorine element of the $WF_6$ gas. The $WF_6$ gas is injected into a reaction chamber to deposit the tungsten layer after the formation of the contact hole, and in order to form a stable Ti silicide. In case of the via hole, a Ti/TiN layer or a TiN layer is formed in the via hole after the formation of the via hole. This is conducted for the enhancement of function and bonding characteristic of a barrier metal. As for a material for forming the barrier metal, TiW by a sputtering process, Ti/TiN by the sputtering process, TiN by CVD process or WN by the sputtering process are mainly used. The barrier metal is used because the tungsten layer has poor contact characteristics with a silicon substrate or an oxide layer and is well-grown on a specific layer. A film quality of the barrier metal has a great influence on the film quality of the tungsten layer in an initial nucleation stage and therefore on the whole tungsten layer. The barrier layer serves to prevent damage of a semiconductor device due to the intrusion of a fluorine element of $WF_6$ gas, which is used in the deposition of the tungsten layer, into the semiconductor device.

In the prior art, Ti/TiN layers are sputtered to form a barrier metal for large sized contact or via holes. Ionized Metal Plasma (IMP)-Ti/CVD-TiN layers are used as the barrier metal for small sized contact or via holes.

In the method of forming Ti/TiN layers using the sputtering process, an overhang phenomenon of the Ti/TiN layers 13 and 15 occurs at upper corner portions A of the contact hole 12 of an insulating layer 11 of a semiconductor substrate 10, as shown in FIG. 1. This is attributable to defective step coverage. Also, at lower corner portions of the contact hole 12, a volcano defect may be caused upon deposition of the tungsten layer (not shown) for filling the contact hole 12 because the Ti layer 13 is easily exposed. Since the step coverage of the Ti/TiN layers 13 and 15 is bad, the tungsten layer does not completely fill the contact hole so that a void can occur in the contact hole 12. As a result, this method is not well suited for a micro semiconductor device of 0.18 μm or less.

In the method using IMP-Ti/CVD-TiN layers as a barrier metal, the Ti layer 23 causes a degradation of the bonding properties with the insulating layer 11 because the step coverage at the sidewall C of the contact hole 12 of the insulating layer 11 of the semiconductor substrate 10 is poor.

Also, a TiN layer 25 is deposited on the Ti layer 23 by CVD process and is then plasma-processed. The TiN layer 25 is normally plasma-processed at an outside portion D of the contact hole 12 or at a bottom portion E of the contact hole 12, but cannot be normally plasma-processed along the sidewall F of the contact hole 12 because of the direct motion of the plasma spray. Thus, the Ti/TiN layers 23 and 25 do not completely perform a function as a barrier metal when the tungsten layer fills the contact hole by subsequent CVD process. As a result, the TiN layer 25 at the sidewall F has a defective surface and contains many impurities because of lateral damage caused by the fluorine element. This may cause numerous problems such as an increase in the resistance of the metal thin film, a degradation of the physical properties of the barrier metal layer, an interference of the growth of the tungsten layer (not shown) to fill the contact hole 12, and so forth. This may also cause serious manufacturing problems for micro semiconductor devices of 0.13 μm or less.

In the above-described manufacturing methods, the semiconductor device is moved to separate manufacturing equipment after the deposition of the barrier metal. As such, a vacuum state of the semiconductor substrate may be broken, thus generating a contaminant or natural oxide layer between the barrier metal and the tungsten layer. This may result in a defect in the contact resistance characteristics.

In consideration of the problems associated with the prior art, although it has excellent barrier characteristics, a tungsten nitride (WN) layer as a metal barrier is hardly used at present because of the structural limitations associated with the deposition method using the sputtering process. Thus, it has been required an improvement of deposition method of the tungsten nitride layer.

SUMMARY OF THE INVENTION

Accordingly, it is an aspect of the present invention to overcome the above-mentioned problems occurring in the prior art. It is a further aspect of the embodiments of the present invention to provide a method of manufacturing a semiconductor device, which prevents defects in a semiconductor device by removing a contact defect in a fine contact hole, where the contact hole has a high aspect ratio.

The method improves the step coverage of a barrier metal layer at a fine contact hole. The method further simplifies a deposition process of a tungsten nitride layer as a barrier metal. The method of manufacturing a semiconductor device, includes forming an insulating layer on a semiconductor substrate and then forming a contact hole on the insulating layer. A tungsten nitride layer is deposited as a barrier metal in the contact hole and on the insulating layer using an atomic layer deposition process. The atomic layer deposition process is repeatedly performed in order to produce a tungsten nitride layer having a desired thickness.

BRIEF DESCRIPTION OF THE DRAWINGS

The invention will be described in conjunction with the following drawings in which like reference numerals designate like elements and wherein.

DETAILED DESCRIPTION OF PREFERRED EMBODIMENTS

Hereinafter, a preferred embodiment of the present invention will be described with reference to FIGS. 3 to 8, which illustrate a method of manufacturing a semiconductor device.

Figure 1:
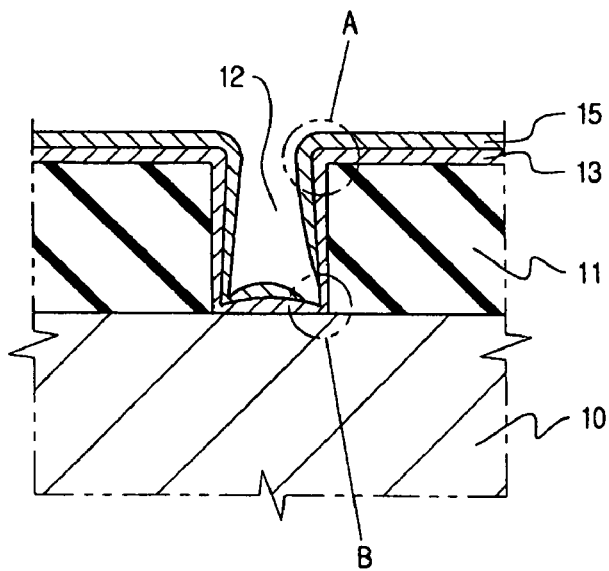
FIG. 1 illustrates an exemplary defect of a barrier metal at a contact hole of a semiconductor device in the related art.
Figure 2:
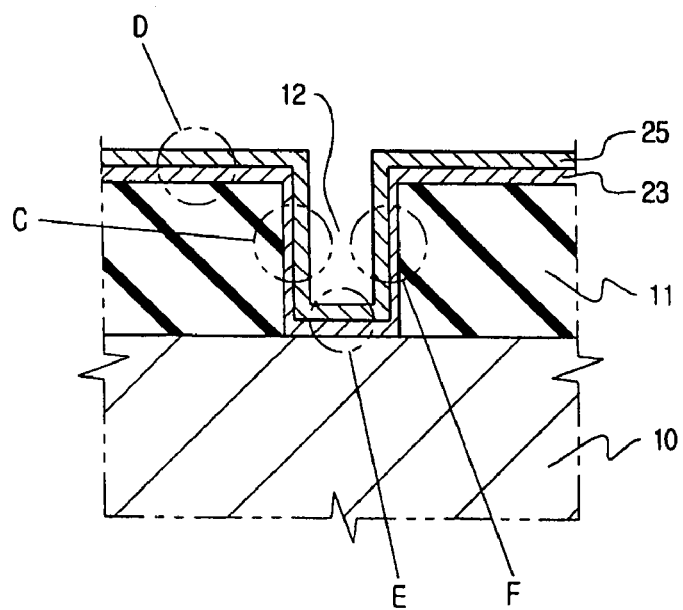
FIG. 2 illustrates another exemplary defect of a barrier metal at a contact hole of a semiconductor device in the related art.
Figure 3:
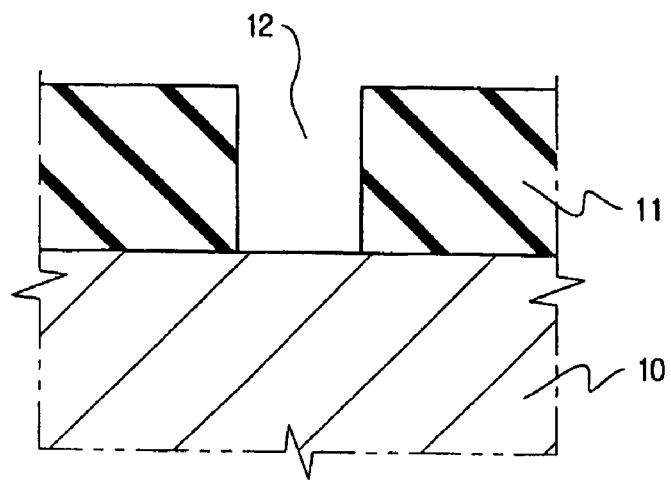
FIGS. 3 to 8 illustrate a method of manufacturing a semiconductor device in accordance with preferred embodiments of the present invention.

An insulating layer 11, such as an oxide layer is formed on a semiconductor substrate 10 to a desired thickness. In order to define an active region on the substrate 10, a field oxide layer is formed on a field region of the semiconductor substrate 10, while a source/drain, a gate electrode, etc. of a transistor are formed on the active region of the substrate 10. A contact hole 12 is formed, by etching a contact part on the insulating layer 11 of the semiconductor substrate 10 using a photolithography process to form a fine contact hole 12 whereby the oxide layer 11 is removed, as shown in FIG. 3. The contact hole 12 preferably has a high aspect ratio.

Referring to FIGS. 4 to 7, a barrier metal is deposited on the semiconductor substrate 10. The barrier metal is preferably a tungsten nitride (WN) layer. The barrier layer is preferably deposited by an atomic layer deposition ("ALD"), which can be performed in a single reaction chamber (e.g., a reaction chamber for tungsten process). Herein, the reaction chamber is preferably maintained at a pressure of 10 to 350 Torr and a temperature of 250° C. to 550° C.

Figure 4:
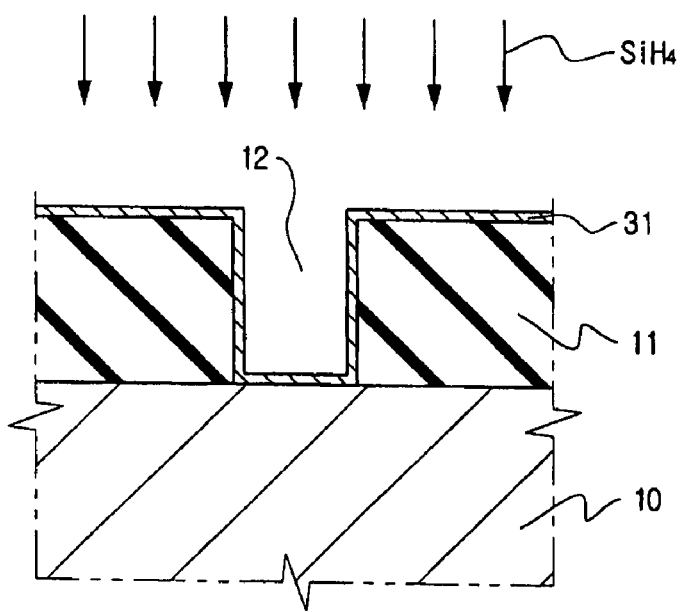

The formation of the barrier metal will now be described in greater detail. The semiconductor substrate 10 is mounted in the reactive chamber. An $SiH_4$ gas, which is a reactive gas, is injected into the reaction chamber. The $SiH_4$ gas is preferably injected at a flow rate of 5 to 200 Standard Cubic Centimeter per Minute (SCCM). This process deposits a silicon single atomic layer 31 on the insulating layer 11 and on the whole inner surface of the contact hole 12, as shown in FIG. 4. After the layer 31 is deposited, an inert gas is injected into the reaction chamber as a purging gas to completely discharge any unreacted $SiH_4$ gas from the reaction chamber. The inert gas can be Ar gas or a mixture of Ar gas and $H_2$ gas.

Figure 5:
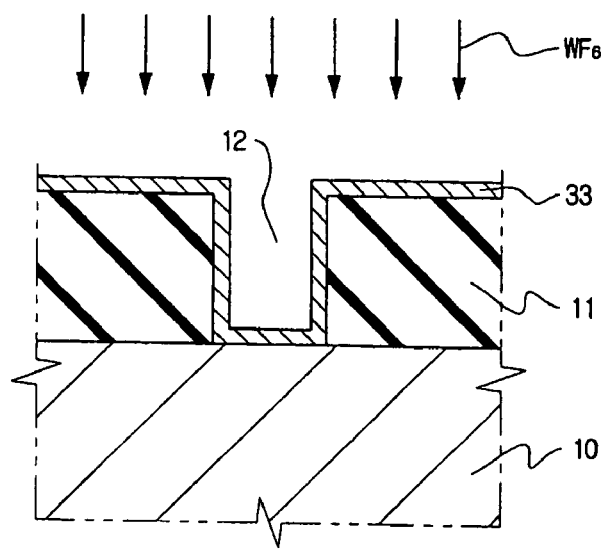

$WF_6$ gas, the reactive gas, is then injected into the reaction chamber. The $WF_6$ gas is preferably injected at a flow rate of 5~200 SCCM. The $WF_6$ deposits a tungsten single atomic layer 33, which reacts with the silicon atoms of the silicon layer 31 whereby a $SiF_4$ gas is produced in the reaction chamber and a tungsten single atomic layer 33, as shown in FIG. 5, remains. The $SiH_4$ gas is injected before injecting the $WF_6$ gas to prevent any damage to the silicon surface of the contact hole 12 if directly exposed to the $WF_6$ gas. After the layer 33 is deposited, an inert gas is injected into the reaction chamber as a purging gas to completely discharge the $SiF_4$ gas from the reaction chamber. The inert gas can be Ar gas or a mixture of Ar gas and $H_2$ gas.

Figure 6:
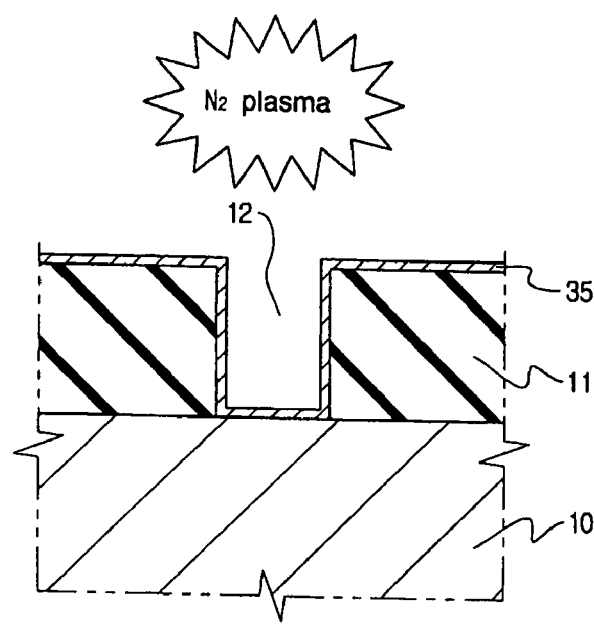
Figure 7:
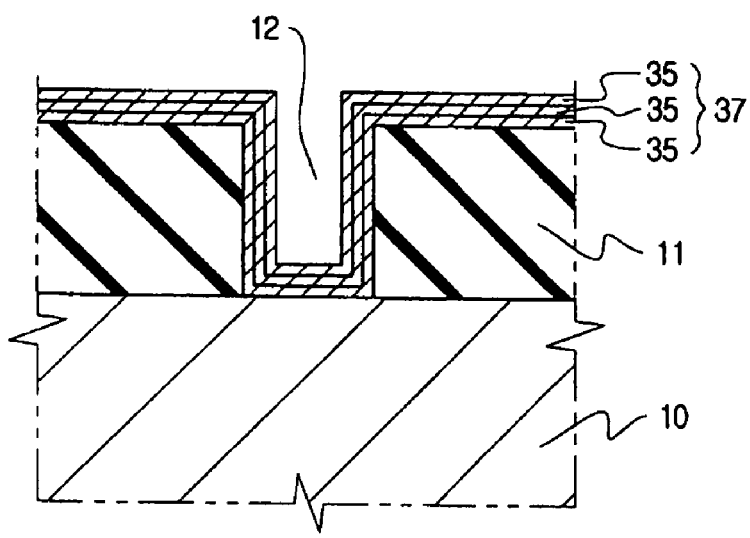

To increase a bonding force of W and N2, the tungsten layer 33 is then plasma-processed using, for example, $N_2$ gas, which transforms the tungsten layer 33 into a tungsten nitride layer 35 having a thickness of a few Å, as shown in FIG. 6. To increase the reaction efficiency upon deposition of the tungsten nitride layer 35, preferably, hydrogen gas ($H_2$) or Ar gas is also injected into the reaction chamber.

The ALD process described above for the formation of layers 31, 33 and 35 is repeated to increase the thickness of the tungsten nitride layer 35 to have a desired thickness. The desired thickness can be 3 to 100 Å. In the embodiment, shown in FIG. 7, the ALD process is repeated three times so as to form three tungsten nitride layers 35, which together form a finished tungsten nitride layer 37. The step coverage of the tungsten nitride layer 37 at the contact hole 12 is improved when compared with the conventional barrier metal. Although the tungsten nitride layer 37 is illustrated to be composed of three tungsten nitride layers 35 for a convenience of explanation, in fact, the ALD process can be repeatedly performed any number of times to form a tungsten nitride layer having a desired thickness.

Figure 8:
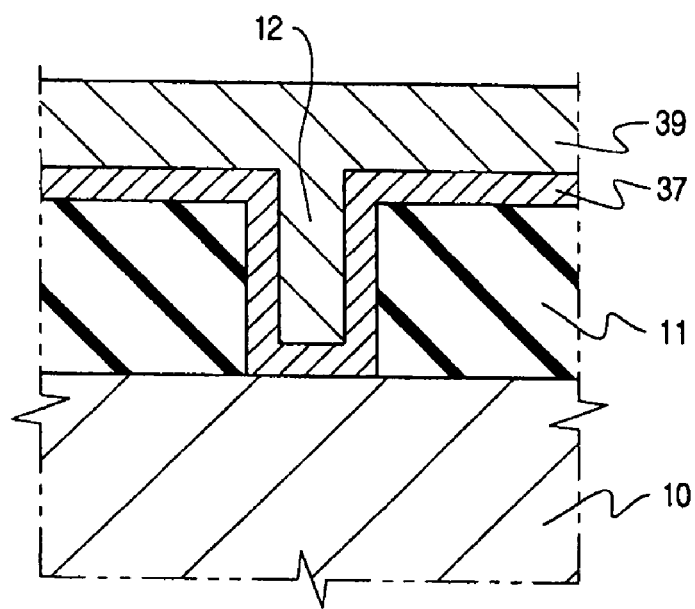

Using a conventional deposition process for tungsten, a tungsten layer 39 is deposited on the tungsten nitride layer 37, as shown in FIG. 8. The tungsten layer 39 can have a thickness of 300 to 500 Å, which completely fills the contact hole 12, as shown in FIG. 8. The tungsten nitride layer 37 and the tungsten layer 39 are preferably in-situ deposited in the same reaction chamber (e.g., the reaction chamber for tungsten process).

A chemical mechanical polishing (CMP) process or an etch back process is then performed such that the tungsten layer is planarized and a pattern of a metal layer is formed on the tungsten layer in the contact hole 12.

Although this embodiment has been described with reference to the contact hole for a convenience of explanation, the present method is not intended to be so limited; rather, the method disclosed herein can be used to a via hole instead of the contact hole. The method disclosed herein improves the step coverage of the barrier metal at the contact hole or via hole by depositing the tungsten nitride layer, the barrier metal, in the fine contact hole having high aspect ratio using the ALD process. This reduces the contact defect of the semiconductor device employing the tungsten nitride layer as the barrier metal and, further, increases yield rate of the semiconductor device.

The present method provides a simplified manufacturing process and process equipment, while increasing productivity increase, and reducing cost because the deposition of the tungsten nitride layer and the tungsten layer for filling the contact hole can be performed in the same reaction chamber.

As described above, the tungsten single atomic layer is deposited in the contact hole of the semiconductor substrate using the ALD process and the tungsten nitride layer is formed by plasma-processing the tungsten single atomic layer using nitrogen gas. The tungsten nitride layer is formed to have a desired thickness by repeatedly performing the ALD process. Then, the tungsten layer is deposited on the semiconductor substrate to fill the contact hole. Herein, the tungsten nitride layer and the tungsten layer can be in-situ deposited in a same reaction chamber. Accordingly, the present method improves the step coverage of the tungsten nitride layer, the barrier metal, thus reducing the contact defects of the fine contact hole having a high aspect ratio.

Although preferred embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. A method of manufacturing a semiconductor device, comprising:
    forming an insulating layer on a semiconductor substrate;
    forming a contact hole on the insulating layer;
    depositing a tungsten nitride layer as a barrier metal layer in the contact hole and on the insulating layer using an atomic layer deposition process; wherein said depositing the tungsten nitride layer comprises:
    depositing a silicon single atomic layer in the contact hole;
    forming a tungsten single atomic layer after said depositing the single silicon single atomic layer; and
    forming the tungsten nitride layer by plasma-processing the tungsten single atomic layer; and
    performing the atomic layer deposition process a plurality of times to produce a barrier metal layer having a desired thickness.

2. The method of claim 1, further comprising:
    performing a deposition process to deposit a tungsten layer to fill the contact hole.

3. The method according to claim 2, wherein the barrier metal layer is a tungsten nitride layer.

4. The method of claim 3, wherein the tungsten nitride layer and the tungsten layer are in-situ deposited in a reaction chamber.

5. The method of claim 3, wherein the tungsten nitride layer and the tungsten layer are in-situ deposited in a reaction chamber for depositing the tungsten layer.

6. The method of claim 4, wherein the reaction chamber is maintained at a pressure of 10 to 350 Torr.

7. The method of claim 4, wherein the reaction chamber is maintained at a temperature of 250 to 550° C.

8. The method according to claim 1, wherein the silicon single atomic layer is deposited using $SiH_4$ gas.

9. The method of claim 8, wherein the $SiH_4$ gas is injected at a flow rate of 5 to 200 SCCM.

10. The method according to claim 1, wherein the tungsten single atomic layer is formed using $WF_6$ gas, wherein the silicon of the silicon single atomic layer reacts with $WF_6$ gas.

11. The method of claim 10, wherein the $WF_6$ gas is injected at a flow rate of 5 to 200 SCCM.

12. The method of claim 1, wherein the tungsten nitride layer is formed by plasma-processing the tungsten single atomic layer using nitrogen gas.

13. The method of claim 1, wherein the barrier layer has a total thickness of 3 to 100 Å.

14. The method of claim 1, wherein the tungsten nitride layer has a total thickness of 3 to 100 Å.

* * * * *